United States Patent [19]

Oda et al.

[11] Patent Number: 4,919,077
[45] Date of Patent: Apr. 24, 1990

[54] SEMICONDUCTOR PRODUCING APPARATUS

[75] Inventors: Masao Oda; Toshiyuki Kobayashi; Yoshimi Kinoshita, all of Amagasaki, Japan

[73] Assignee: Mitsubishi Denki Kabushiki Kaisha, Japan

[21] Appl. No.: 247,443

[22] PCT Filed: Dec. 26, 1987

[86] PCT No.: PCT/JP87/01045
§ 371 Date: Aug. 23, 1988
§ 102(e) Date: Aug. 23, 1988

[30] Foreign Application Priority Data

Dec. 27, 1986 [JP] Japan ................. 61-314111
Apr. 15, 1987 [JP] Japan ................. 62-93521

[51] Int. Cl.$^5$ ............................................. C23C 16/50
[52] U.S. Cl. ........................ 118/723; 118/722; 118/725; 427/38; 427/45.1; 427/53.1; 427/54.1
[58] Field of Search .............. 118/722, 723, 725; 427/37, 38, 45.1, 53.1, 54.1, 255.2

[56] References Cited

U.S. PATENT DOCUMENTS

| | | | |
|---|---|---|---|
| 4,687,544 | 8/1987 | Bersin | 156/345 |
| 4,728,528 | 3/1988 | Ishihara et al. | 427/53.1 |
| 4,732,793 | 3/1988 | Itoh | 118/723 |
| 4,801,468 | 1/1989 | Ishihara et al. | 427/255.2 |

FOREIGN PATENT DOCUMENTS

| | | | |
|---|---|---|---|
| 57-26441 | 2/1982 | Japan . | |
| 59-188913 | 10/1984 | Japan . | |
| 60-43487 | 3/1985 | Japan | 427/54.1 |
| 60-116125 | 6/1985 | Japan | 118/723 |
| 60-245217 | 12/1985 | Japan . | |
| 61-168229 | 7/1986 | Japan | 118/722 |
| 61-170037 | 7/1986 | Japan | 118/722 |
| 61-230326 | 10/1986 | Japan . | |
| 1224318 | 10/1986 | Japan | 118/726 |

Primary Examiner—Richard Bueker
Assistant Examiner—Terry J. Owens
Attorney, Agent, or Firm—Leydig, Voit & Mayer

[57] ABSTRACT

A semiconductor producing apparatus for use in photo-chemical vapor deposition for forming various types of film on a substrate at a low temperature as a first reaction gas excited and decomposed by a laser beam and a second reaction gas converted into a plasma state by a plasma generator react with each other in a reaction chamber in which a substrate is mounted. Two kinds of electrodes are provided in upper and lower positions in the reaction chamber opposing each other. The upper electrode is connected to a high-frequency power source and the lower electrode is used as a common electrode on which the substrate is mounted to control film forming speed, while an ultraviolet light source for irradiating the interior of the reaction chamber with ultraviolet rays is provided to obtain a dense film.

12 Claims, 4 Drawing Sheets

SEMICONDUCTOR PRODUCING APPARATUS

TECHNICAL FIELD

The present invention relates to a semiconductor producing apparatus, and more particularly to a photochemical vapor deposition apparatus for forming a chemical vapor deposited film on a heated substrate by subjecting a reaction gas supplied into a reaction chamber to decomposition by the energy of light applied thereto through a light transmissive window from the outside of the reaction chamber.

BACKGROUND ART

In recent years, plasma chemical vapor deposition and photochemical vapor deposition have come to be highlighted as methods of forming films on substrates. These processes reflect the trend toward utilizing low temperatures in producing semiconductor devices including integrated circuits.

In photochemical vapor deposition (chemical vapor deposition, which will be referred to as CVD hereafter), light energy such as a laser beam and an ultraviolet light is used as an energy source for CVD. An excimer laser or a carbon dioxide gas laser is generally employed as the laser, while a low-pressure mercury lamp, a high-pressure mercury lamp, or a deuterium lamp is used as an ultraviolet light source.

FIG. 4 is a cross-sectional view schematically illustrating a conventional optical CVD apparatus which is applied to the above-described method, as disclosed in, for instance, Japanese Patent Laid-Open No. 152023/1985. In the drawing, the conventional optical CVD apparatus comprises the following components or substances: a reaction vessel 1 constituting a reaction chamber 1a; a substrate 2 on which a film is formed; a fixing base 3 for mounting the substrate thereon; a heater 4 for heating the substrate on the fixing base 3; a reaction gas 5 such as a silane gas; a post-reaction gas 6; a reaction gas supplying port 7; a gas discharge port 8; light transmissive windows 9 formed of a light transmissive material; a carbon dioxide gas laser oscillator 10; an optical system 11 for reducing the diameter of a carbon dioxide gas laser beam; a carbon dioxide gas laser beam 12 generated by the laser oscillator 10 and used to excite and decompose the reaction gas; and a damper 13 for absorbing the carbon dioxide gas laser beam which has passed through the reaction chamber.

In this apparatus, when the silane gas 5 is supplied from the supply port 7 to the reaction chamber 1a, the silane gas 5 is excited and decomposed by the carbon dioxide gas laser beam 12 which enters through the transmissive window 9 after it is generated by the carbon dioxide gas laser oscillator 10 and its beam diameter is then reduced by the optical system 11. The reason for this is that resonance absorption takes place at a wavelength of 10.59 $\mu$m of the carbon dioxide gas laser. A reaction product obtained as a result is deposited on the substrate 2 heated to a low temperature by the heater 4, and an amorphous silicon film is formed on the substrate 2. The post-reaction gas 6 is discharged through the discharge port 8. The carbon dioxide gas laser beam 12 which has passed through the reaction chamber 1a is absorbed by the damper 13.

With the conventional semiconductor producing apparatus, it is possible to form an amorphous silicon film on a substrate by decomposing the silane gas by the carbon dioxide gas laser beam, as described above. However, the type of film formed is disadvantageously restricted to the amorphous silicon film, and it is difficult to form a silicon oxide film or a silicon nitride film by using the above-described apparatus since oxygen, nitrogen suboxide, nitrogen, or ammonia which is supplied by being added to the silane gas is difficult to decompose by the carbon dioxide gas laser.

Accordingly, it is a primary object of the present invention to provide a semiconductor producing apparatus which is capable of forming a silicon oxide film and a silicon nitride film in addition to an amorphous silicon film and which is capable of forming the amorphous silicon film at a high speed as compared with a conventional apparatus, thereby overcoming the above-described drawback of the prior art.

Another object of the present invention is to provide a semiconductor producing apparatus which is capable of controlling a film forming speed during film formation, thereby making it possible to obtain a uniform distribution of film thickness during film formation.

Still another object of the present invention is to provide a semiconductor producing apparatus which is capable of rendering active the surface of a substrate and a film surface on which active species are deposited consecutively during film formation, thereby making it possible to form a dense film on the substrate.

DISCLOSURE OF INVENTION

A semiconductor producing apparatus according to one aspect of the present invention is provided with an introduction gas supplying port being separate from a reaction supplying port, and the introduction gas is introduced into a reaction chamber after being converted into a plasma state. For instance, as oxygen or nitrogen suboxide, after being converted into a plasma state, is introduced through the introduction gas supplying port into the reaction chamber and undergoes reaction with silane decomposed by the carbon dioxide gas laser, it is possible to form a silicon dioxide film at a low temperature. Similarly, as nitrogen or ammonia converted into a plasma state is introduced, it becomes possible to form a silicon nitride film at a low temperature. In addition, if argon converted into a plasma state is introduced, excited argon collides against silane in the reaction chamber, which promotes the decomposition of silane, and it thus becomes possible to form a amorphous silicon film at a high speed and at a low temperature.

A semiconductor producing apparatus according to another aspect of the invention is provided with two kinds of electrodes disposed in upper and lower positions, respectively, in a reaction vessel opposing each other, the upper one of the electrodes being either a single electrode connected to a high-frequency power source or by a plurality of electrodes each connected to a high-frequency power source, and the lower electrode being a common electrode on which a substrate for forming a film is mounted. Accordingly, by establishing voltages to be applied to the electrodes at the time of forming a film on the substrate, it becomes possible to control the film forming speed.

A semiconductor producing apparatus according to still another aspect of the present invention is provided with an ultraviolet light source disposed adjacent to a reaction vessel and for irradiating the inside of the reaction vessel; and two kinds of electrodes disposed in upper and lower positions, respectively, in the reaction vessel opposing each other, the upper one of the electrodes being either a single mesh electrode connected to a high frequency power source or a plurality of mesh electrodes each connected to a high-frequency power source, and the lower electrode being a common electrode on which a substrate for forming a film is mounted. As a result, it becomes possible to photoionize part of the reaction gas with ultraviolet rays and to prolong the life of its activity, and it becomes possible to form a dense film on the substrate.

BEST MODE FOR CARRYING OUT THE INVENTION

Figure 1:
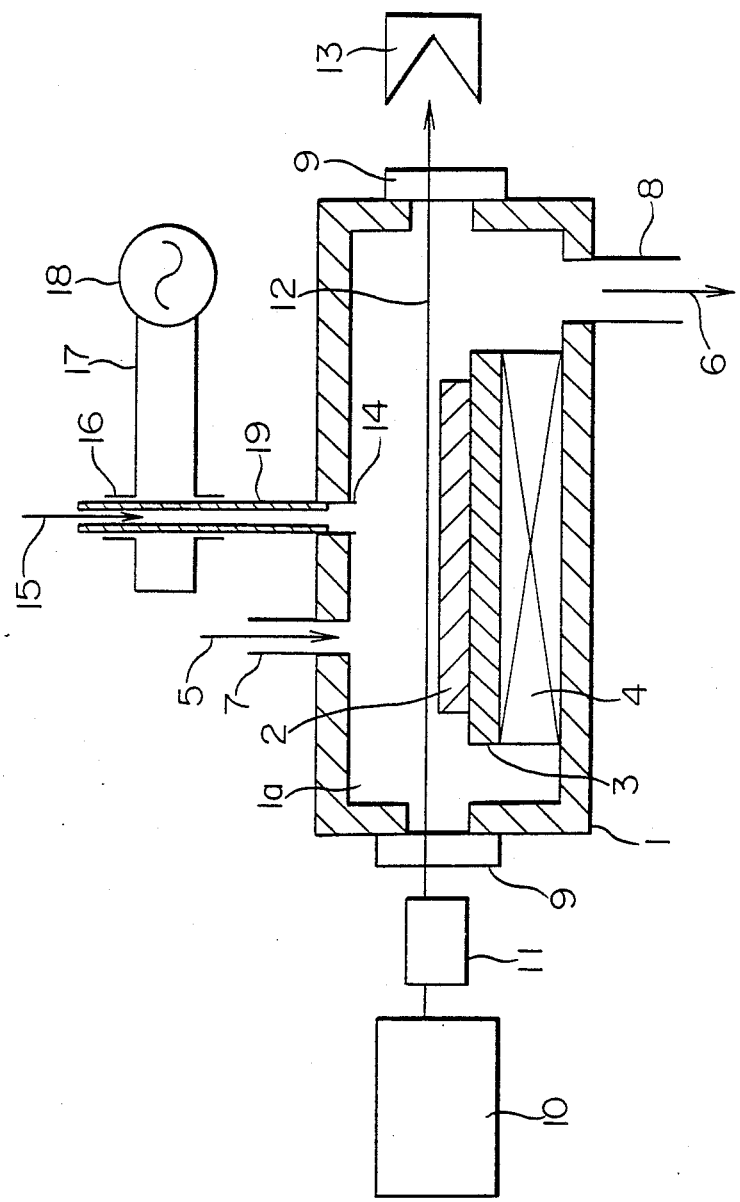
FIG. 1 is a cross-sectional view of a semiconductor producing apparatus in accordance with an embodiment of the present invention.
Figure 4:
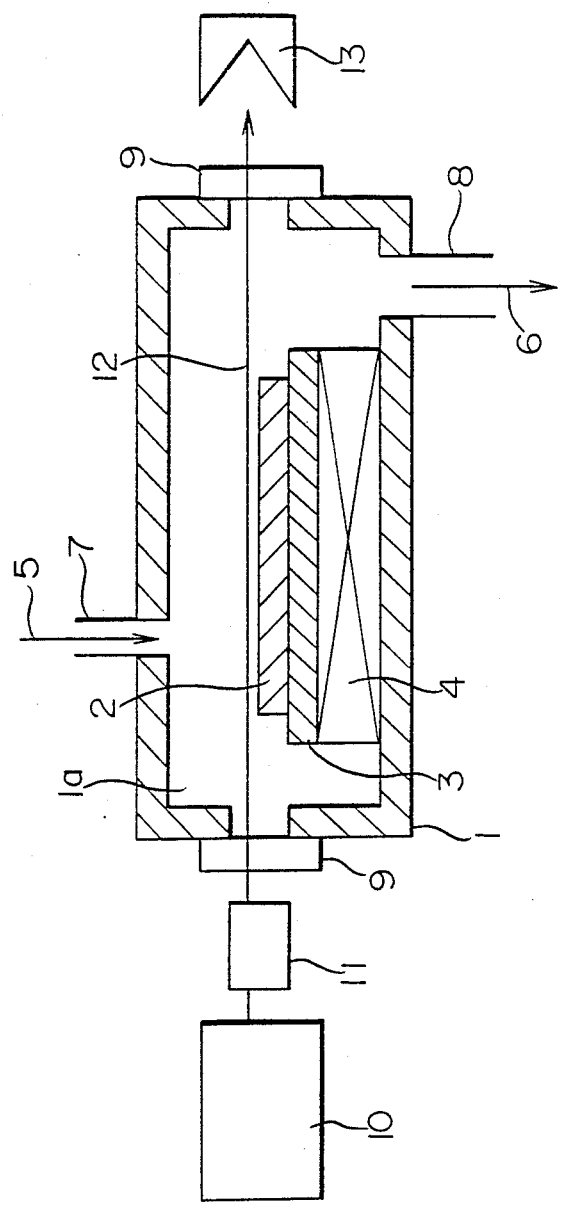
FIG. 4 is a cross-sectional view illustrating a conventional semiconductor producing apparatus.

Referring now to the accompanying drawings, a description will be given of an embodiment of the present invention. FIG. 1 is a cross-sectional view schematically illustrating a semiconductor producing apparatus in accordance with an embodiment of the present invention. In the drawing, numerals 1 to 13 denote the same components or substances as those shown in FIG. 4. To give an outline of this embodiment, in the drawing, reference numeral 1 denotes the reaction vessel forming the reaction chamber 1a and having on opposite sides thereof windows 9 through which the carbon dioxide gas laser beam 12 is transmitted. The reaction gas supplying port 7, which is open in the direction perpendicular to the axial direction of the carbon dioxide gas laser beam 12, is provided at an upper portion of the reaction vessel 1. The silane gas 5 which serves as a first reaction gas is supplied through the gas supplying port 7. In addition, a gas introducing port 14 is also provided at the upper portion of the reaction vessel 1, and an introduction gas 15, which serves as a second reaction gas converted into a plasma state by a microwave oscillator 18, is introduced through the gas introducing port 14.

Namely, the introduction gas 15 is oxygen or nitrogen suboxide when a silicon oxide film is formed; nitrogen or ammonia when a silicon nitride film is formed; or argon when an amorphous silicon film is formed at high speed. Numeral 16 denotes a plasma generating furnace; 17, a waveguide including a matching device, a directional coupler, a converting waveguide, etc.; 18, a microwave oscillator; and 19, a plasma generating pipe comprising a quartz pipe. The plasma generating pipe 19 is connected to the reaction chamber 1a via a port or a metal adapter and is used to supply into the reaction chamber 1a the introduction gas converted into a plasma state by microwaves.

When a silicon oxide film is formed on the substrate 2, oxygen or nitrogen suboxide 15 is supplied into the plasma generating pipe 19, and is introduced into the reaction chamber 1a after being converted into a plasma state upon excitation by the microwaves. This excited oxygen or nitrogen suboxide is introduced through the reaction gas supplying port 7 and reacts with silane 5 decomposed by the carbon dioxide gas laser beam 12, forming a silicon oxide film on the substrate 2. When a silicon nitride film is formed on the substrate 2, nitrogen or ammonia 15 is supplied into the plasma generating pipe 19, and is introduced into the reaction chamber 1a after being converted into a plasma state upon excitation by the microwaves. This excited nitrogen or ammonia is introduced through the reaction gas supplying port 7 and reacts with silane 5 decomposed by the carbon dioxide gas laser beam 12, forming a silicon nitride film on the substrate 2. When an amorphous silicon film is formed on the substrate 2 at a high speed, argon 15 is supplied into the plasma generating pipe 19, and is introduced into the reaction chamber 1a after being converted into a plasma state upon excitation by the microwaves. This excited argon collides with silane 5 in the reaction chamber 1a and decomposes the silane 5, and it is thus possible to form an amorphous silicon film on the substrate 2, coupled with the decomposing action of the silane 5 by the carbon dioxide gas laser beam 12.

It should be noted that although silane is used as the reaction gas in the above-described embodiment, disilane, trisilane or the like may be used instead of silane.

As described above, in accordance with the present invention, the arrangement is provided such that an introduction gas supplying port is provided separately from a reaction gas supplying port, and the introduction gas is introduced into a reaction chamber after being converted into a plasma state, and a thin film is formed on a substrate by means of the reaction gas excited and decomposed by the laser beam and the introduction gas converted into a plasma state. Therefore, there is the advantage that it is possible to provide a semiconductor producing apparatus which is capable of forming a silicon oxide film and a silicon nitride film at a low temperature and of forming an amorphous silicon film at a high speed and at a low temperature.

In the semiconductor producing apparatus shown in FIG. 1, since the structure is such that the gas supplying port 17, the gas introducing port 14, and the beam incidence window 9 are located on one side of the substrate 2, there is a possibility that the film forming speed may become locally high, resulting in variations in the film thickness. In other words, the fact that the beam incidence window 9, the gas supplying port 7, and the gas introducing port 14 are located on one side of the substrate 2 means that the power density may become high in the vicinity of those parts of the apparatus, with the result that the exciting energy may become high and the molecular density of the gas involved in the reaction for the film formation may become high.

Figure 2:
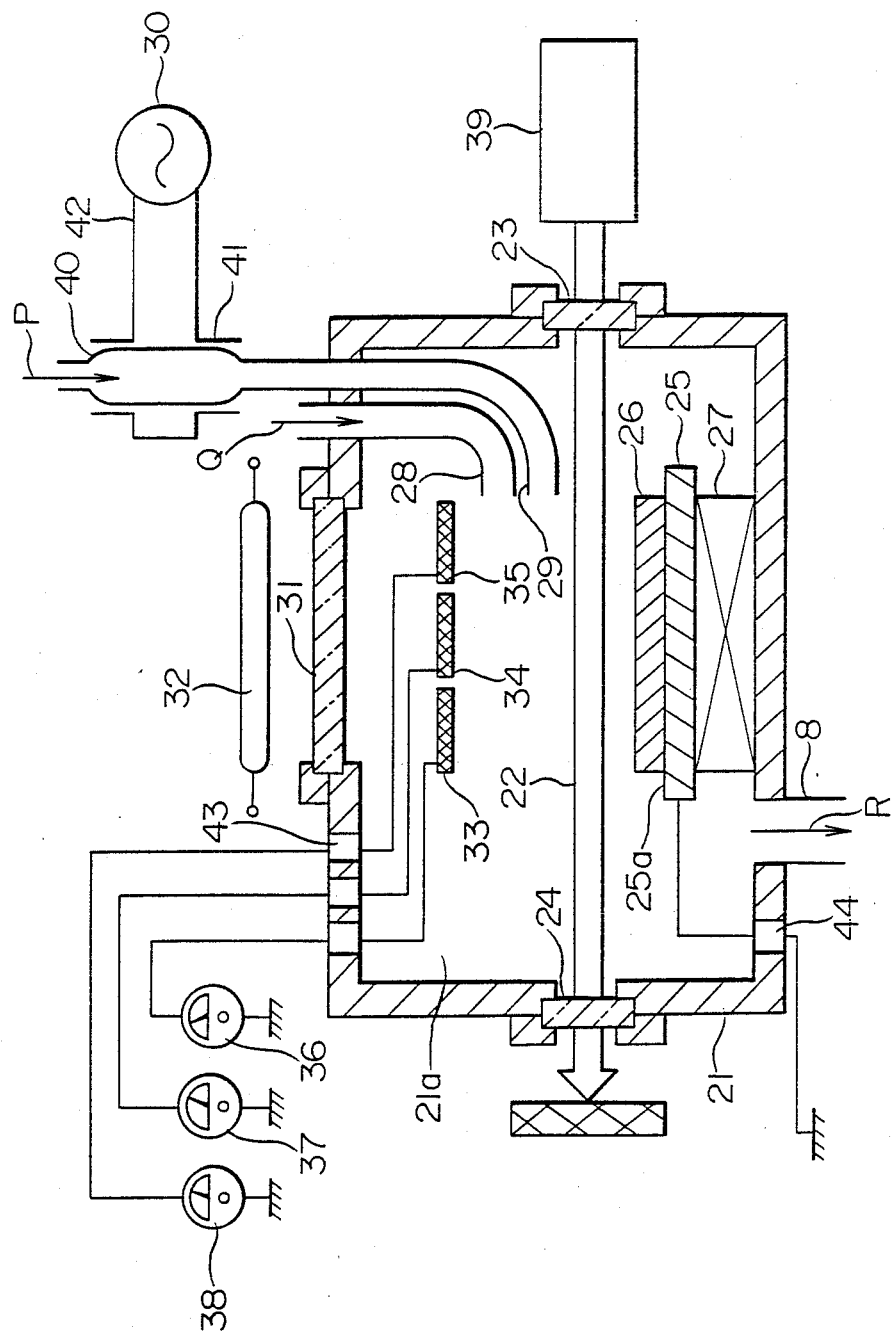
FIG. 2 is a cross-sectional view of a semiconductor producing apparatus in accordance with another embodiment of the present invention.

A semiconductor producing apparatus in accordance with another embodiment of the present invention, shown in FIG. 2, is capable of obtaining a uniform distribution of the film thickness by controlling the film forming speed in order to overcome the above-described problem of the apparatus shown in FIG. 1.

In FIG. 2, reference numeral 21 denotes a reaction vessel constituting a reaction chamber 21a and provided with a beam incidence window 23 and a beam emergence window 24 through both of which a carbon dioxide gas laser beam 22 is transmitted. Accommodated in this reaction vessel 21 is a heater 27 for heating a substrate 26 disposed on a mounting base 25 and serving as a lower common electrode connected to ground. Provided in an upper portion of the reaction vessel 21 are a gas supplying port 28 and a gas introducing port 29 both having openings oriented in the same direction as the axial direction of the carbon dioxide gas laser beam 22. The silane gas, disilane gas, or trisilane gas which serves as the first reaction gas is supplied into the reaction vessel 21 through the gas supplying port 28. Meanwhile, oxygen or nitrogen suboxide which serves as the second reaction gas converted into a plasma state by a microwave oscillator 30 is introduced through the gas introducing port 29. Reference numeral 31 denotes a window through which ultraviolet rays are transmitted, the window 31 being disposed on the reaction vessel 21 above the mounting base 25. Numeral 32 denotes an ultraviolet light source such as a low-pressure mercury lamp or the like, which is provided adjacent to the reaction vessel 21 for irradiating the inside of the vessel 21 with ultraviolet rays. Numerals 33 to 35 denote upper electrodes disposed inside the reaction vessel 21 along the direction of propagation of the laser beam opposing a mounting surface 25a of the mounting base 25, the electrodes 33–35 being respectively connected to high-frequency power sources 36–38. The electrodes 33–35 are mesh electrodes which are obtained by etching stainless steel thin plates (not shown) to obtain a transmittance of 90% or more. Numeral 39 denotes a carbon dioxide gas laser oscillator for issuing the carbon dioxide gas laser beam 22. The carbon dioxide gas laser oscillator 39 is disposed outside the reaction vessel 21 exciting and decomposing the first reaction gas during film formation. In addition, numeral 40 denotes a plasma generating pipe; 41 denotes a plasma generating furnace; 42 denotes a waveguide; 43 and 44 denote feed throughs for introducing electric currents to electrodes 33, 34, and 35 and mounting base 25. Incidentally, arrows P, Q and R in the drawing indicate the directions of gas flow.

In the semiconductor producing apparatus thus constructed, when a film is formed on the substrate 26, it is possible to freely set the voltages to be applied to the electrodes 33–35 by the high-frequency power sources 36–38.

Accordingly, when, for instance, an oxide film is formed on the substrate 26, since the film forming speed can be controlled, even if the beam incidence window 23 of the carbon dioxide gas laser beam 22, the gas supplying port 28, and the gas introducing port 29 are disposed on one side of the substrate 26, the film forming speed is prevented from becoming locally high. In this case, if high-frequency voltages are not applied to the electrodes 33–35, the thickness of the film formed on the substrate 26 will become large in the vicinity of the gas supplying port 28, the gas introducing port 29, and the beam incidence window 23. However, if high-frequency voltages $E_1$, $E_2$, $E_3$ ($E_1 > E_2 > E_3$) are applied to the electrodes, it is possible to control the film forming speed in the direction of the gas flow and the direction of propagation of the laser beam, so that a uniform film can be obtained. Incidentally, since the high-frequency voltages are applied to the electrodes 33–35, even if an insulating film of an oxide film or the like is formed on the substrate 26, charges are prevented from being built up on the film surface to destroy the film.

When a silicon oxide film is formed on the substrate 26, oxygen or nitrogen suboxide is introduced into the plasma generating pipe 40 through the gas introducing port 29 in the direction indicated by the arrow P, while the silane gas, the disilane gas, or the trisilane gas is supplied through the gas supplying port 28 in the direction indicated by the arrow Q. At this time, the oxygen or nitrogen suboxide is excited and decomposed by the microwave oscillator 30, and the silane gas, disilane gas or the trisilane gas is excited and decomposed by the carbon dioxide gas laser beam 22.

At this juncture, if the inside of the reaction vessel 21 is irradiated with ultraviolet rays, part of the silane gas, the disilane gas, or the trisilane gas can be photoionized by the energy of ultraviolet rays, and it is possible to prolong the activity of atoms contained in the gas excited and decomposed by the carbon dioxide gas laser beam 22. Similarly, it is also possible to photoionize part of the oxygen or nitrogen suboxide, and its activity can be prolonged. Furthermore, since the surface of the substrate 26 and the film surface on which the active species are consecutively deposited are activated by the energy of ultraviolet rays, the reaction of the substrate 26 and the film surface is promoted, thereby making it possible to obtain a dense film.

In addition, if high-frequency voltages of 1 MHz or more are applied to the electrodes 33–35 (set as positive electrodes), the atoms of the reaction gas partially ionized by the irradiation of the ultraviolet rays advance in an electric field toward the substrate 26 and reach the surface of the substrate 26 and the film surface.

Figure 3:
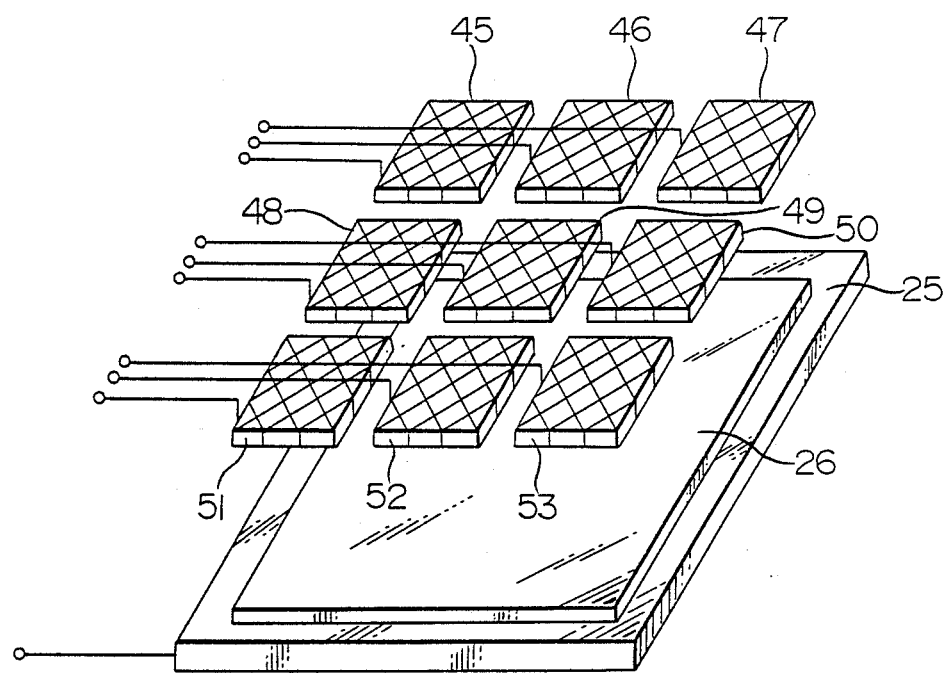
FIG. 3 is a perspective view of electrodes according to still another embodiment of the present invention.

Although, in the embodiment shown in FIG. 2, an example has been shown in which three upper electrodes are provided, the present invention is not restricted to the same. For instance, if nine electrodes 45–53 are provided, as shown in FIG. 3, or a single electrode (not shown) is used, it is possible to control the film forming speed in the same way as the embodiment shown in FIG. 2.

In addition, although in the foregoing embodiments an example has been shown in which a carbon dioxide gas laser oscillator is used as a laser oscillator, an excimer laser oscillator may be used instead of it.

Moreover, the type of the ultraviolet light source 32 in the present invention is not restricted to the above-described embodiment, and a light source of, for instance, a high-pressure mercury lamp or a deuterium lamp may be used. The type of the ultraviolet light source 32 may thus be freely modified, as required.

As described above, according to the present invention, two kinds of electrodes are provided in upper and lower positions, respectively, in a reaction vessel opposing each other, the upper one of the electrodes being either a single electrode connected to a high-frequency power source or a plurality of electrodes each connected to a high-frequency power source, and the lower electrode being a common electrode on which a substrate for forming a film is mounted. Accordingly, it is possible to freely set the voltages to be applied to the respective electrodes when a film is formed on the substrate. Hence, since the film forming speed can be controlled, it is possible to obtain a uniform distribution of the film thickness.

In addition, according to another aspect of the present invention, an ultraviolet light source is provided adjacent to a reaction vessel for irradiating the inside of the reaction vessel, and two kinds of electrodes are disposed in upper and lower positions, respectively, in the reaction vessel opposing each other, the upper one of the electrodes being either a single mesh electrode connected to a high-frequency power source or a plurality of mesh electrodes each connected to a high-frequency power source, and the lower electrode being a common electrode on which a substrate for forming a film is mounted. Accordingly, it is possible to photoionize part of the reaction gas with the ultraviolet rays, and the activity of the reaction gas can be prolonged. Therefore, the substrate surface and the film surface on which the active species are deposited consecutively can be activated during film formation. Since the reaction of the surfaces of the substrate and the film is thus promoted, it is possible to obtain a dense film.

INDUSTRIAL APPLICABILITY

As described above, the semiconductor producing apparatus in accordance with the present invention is useful in forming at a low temperature various types of thin films, such as a silicon oxide film, a silicon nitride film, and an amorphous silicon film, on a semiconductor substrate of silicon, and makes it possible to form a highly dense film with a uniform thickness on a substrate with a large area.

We claim:

1. An apparatus for depositing a film on a surface of a substrate comprising:
   a chamber;
   holding means for holding a substrate disposed within said chamber;
   means for heating a substrate disposed within said chamber;
   a first port for introducing into said chamber a first gas including at least one of the elemental constituents of the film to be deposited;
   plasma means for forming a plasma in a second gas flowing toward said chamber;
   a second port for introducing into said chamber the flow of the second gas after passage through said plasma means;
   first and second windows in said chamber for transmission of laser light and ultraviolet light, respectively, into said chamber;
   a laser disposed outside said chamber for generating laser light transmitted into said chamber through said first window for decomposing the first gas near a substrate held by said holding means;
   an ultraviolet light source disposed outside said chamber for generating ultraviolet light transmitted into said chamber through said second window for interacting with the first gas near a substrate held by said holding means;
   a first electrode disposed in said chamber and electrically connected to a substrate held by said holding means;
   a second electrode disposed in said chamber opposite said first electrode; and
   a voltage source connected across said first and second electrodes for electrostatically urging ionized species in said chamber toward a substrate held by said holding means.

2. The apparatus of claim 1 wherein said second window is disposed opposite the substrate for irradiation of the surface of the substrate with ultraviolet light.

3. The apparatus of claim 2 wherein the second electrode is disposed between the second window and the substrate, said second electrode being a metal mesh having an ultraviolet light transmittance of at least 90 percent.

4. The apparatus of claim 1 including third and fourth electrodes disposed in said chamber opposite said second electrode and second and third independently controllable voltage sources connected across said first and third and said first and fourth electrodes, respectively, for controlling the rate of film deposition on the surface of the substrate opposite the respective third and fourth electrodes.

5. The apparatus of claim 4 wherein said first and second ports direct the flows of the first and second gases across the surface of the substrate in the same direction, and said second, third and fourth electrodes are disposed along the direction of flow of the gases for controlling the thickness of the deposited film on the substrate in the direction of the flow of the first and second gases.

6. The apparatus of claim 1 including fifth and sixth electrodes disposed opposite the substrate, fourth and fifth independently controllable voltage sources connected across said first and fifth and said first and sixth electrodes, respectively, for controlling the rate of film deposition on the substrate opposite said fifth and sixth electrodes wherein said first and second ports direct the flows of said first and second gases across the substrate in the same direction, and said second, fifth and sixth electrodes are disposed transverse to the direction of flow of the first and second gases for controlling the thickness of the deposited film on the substrate in a direction transverse to the direction of flow of the first and second gases.

7. An apparatus for depositing a film on a surface of a substrate comprising:
   a chamber;
   holding means for holding a substrate disposed within said chamber;
   means for heating a substrate disposed within said chamber;
   a first port for introducing into said chamber a first gas including at least one of the elemental constituents of the film to be deposited;
   plasma means for forming a plasma in a second gas flowing toward said chamber;
   a second port for introducing into said chamber the flow of the second gas after passage through said plasma means;
   a first electrode disposed in said chamber and electrically connected to a substrate held by said holding means;
   second, third, and fourth electrodes disposed in said chamber opposite said first electrode; and
   first, second, and third independently controllable voltage sources connected across said first and second, said first and third, and said first and fourth electrodes, respectively, for controlling the rate of film deposition on the substrate opposite said second, third, and fourth electrodes.

8. The apparatus of claim 7 wherein said first and second ports direct the flows of the first and second gases across the surface of the substrate in the same direction, and said second, third and fourth electrodes are disposed along the direction of flow of the gases for controlling the thickness of the deposited film on the substrate in the direction of the flow of the first and second gases.

9. The apparatus of claim 7 wherein said first and second ports direct the flows of the first and second gases across the surface of the substrate in the same direction, and said second, third and fourth electrodes are disposed transverse to the direction of flow of the gases for controlling the thickness of the deposited film on the substrate in a direction transverse to the direction of the flow of the first and second gases.

10. The apparatus of claim 7 including:

first and second windows in said chamber for transmission of laser light and ultraviolet light, respectively, into said chamber;

a laser disposed outside said chamber for generating laser light transmitted through said first window into said chamber for decomposing the first gas near a substrate held by said holding means; and an ultraviolet light source disposed outside said chamber for generating ultraviolet light transmitted into said chamber through said second window for interacting with the first gas near a substrate held by said holding means.

11. The apparatus of claim 10 wherein said second window is disposed opposite the substrate for irradiation of the surface of the substrate with ultraviolet light.

12. The apparatus of claim 11 wherein the second electrode is disposed between the second window and the substrate, said second electrode being a metal mesh having an ultraviolet light transmittance of at least 90 percent.

* * * * *